US005766985A

United States Patent [19]
Mangiagli et al.

[11] Patent Number: 5,766,985
[45] Date of Patent: Jun. 16, 1998

[54] PROCESS FOR ENCAPSULATING A SEMICONDUCTOR DEVICE HAVING A HEAT SINK

[75] Inventors: Marcantonio Mangiagli, Acireale CT; Rosario Pogliese, Gravina Di Catania CT, both of Italy

[73] Assignee: Consorzio per la Ricerca sulla Microelettronica nel Mezzogiorno, Catania Ct, Italy

[21] Appl. No.: 384,753

[22] Filed: Feb. 6, 1995

Related U.S. Application Data

[62] Division of Ser. No. 987,490, Dec. 7, 1992, Pat. No. 5,514,913.

[30] Foreign Application Priority Data

Dec. 5, 1991 [IT] Italy .................... MI91A3266

[51] Int. Cl.$^6$ .................... H01L 21/56; H01L 21/58; H01L 21/603
[52] U.S. Cl. .................... 438/121; 438/122; 438/123; 438/124; 438/127; 264/272.17
[58] Field of Search .................... 437/211, 219, 437/224; 264/272.17, 272.15, 275; 257/796, 676; 438/121, 122, 123, 124, 127

[56] References Cited

U.S. PATENT DOCUMENTS

| 3,715,423 | 2/1973 | Dunn .................... 264/250 |
| 4,266,267 | 5/1981 | Ruegg . |
| 4,835,423 | 5/1989 | de Ferron et al. . |
| 4,888,307 | 12/1989 | Spairisano . |
| 5,063,434 | 11/1991 | Emoto . |
| 5,105,259 | 4/1992 | McShane et al. . |

FOREIGN PATENT DOCUMENTS

| 8203294 | 9/1982 | European Pat. Off. . |
| 121374 | 3/1983 | European Pat. Off. . |
| 52-38885 | 3/1977 | Japan . |
| 55-65450 | 5/1980 | Japan . |
| 59-17273 | 1/1984 | Japan . |
| 60-242649 | 2/1985 | Japan . |
| 61-56420 | 3/1986 | Japan . |
| 61-80845 | 4/1986 | Japan . |
| 61-102040 | 5/1986 | Japan . |
| 61-93652 | 5/1986 | Japan . |
| 61-219144 | 9/1986 | Japan . |
| 62-154656 | 7/1987 | Japan . |
| 63-66953 | 3/1988 | Japan . |
| 63-78558 | 4/1988 | Japan . |
| 63-170949 | 7/1988 | Japan . |
| 63-208255 | 8/1988 | Japan . |
| 63-213362 | 9/1988 | Japan . |
| 1-42844 | 2/1989 | Japan . |
| 1-258452 | 10/1989 | Japan . |
| 1-315147 | 12/1989 | Japan . |
| 2-268457 | 2/1990 | Japan . |
| 3-53551 | 3/1991 | Japan . |
| 3-60146 | 3/1991 | Japan . |

*Primary Examiner*—David Graybill
*Attorney, Agent, or Firm*—Robert Groover; Betty Formby; Matthew Anderson

[57] ABSTRACT

A process for making a package for discrete semiconductor devices, wherein the insulating characteristics of the package are increased by introducing cuts, grooves and positioning holes in the metal plate and shaping in the retractable positioning pins of the metal plate in the molding die.

18 Claims, 7 Drawing Sheets

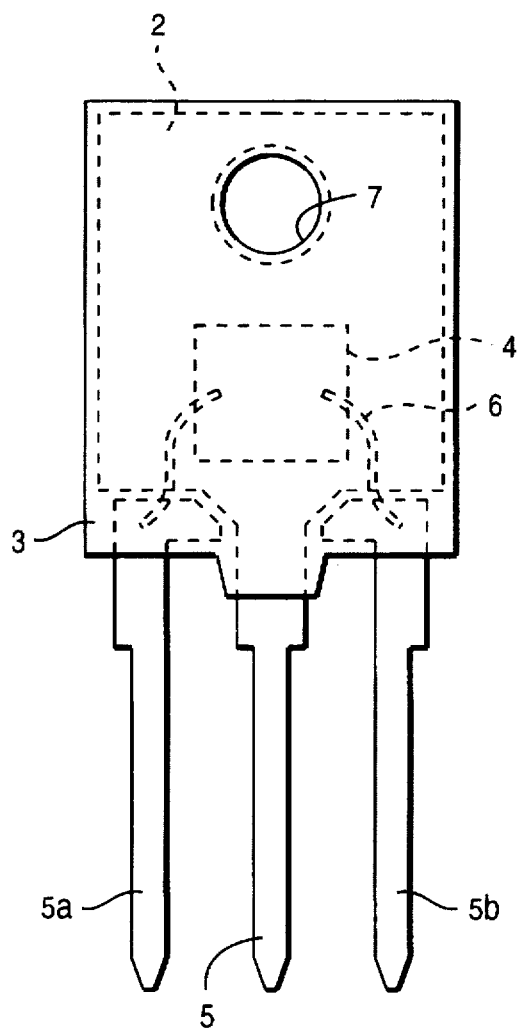
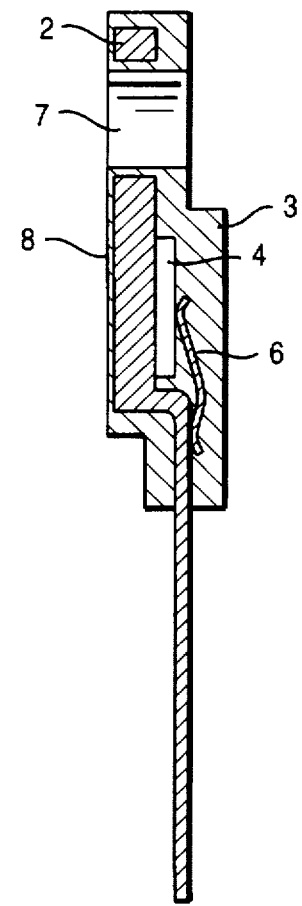
FIG. 3A
PRIOR ART
FIG. 3B
PRIOR ART

PROCESS FOR ENCAPSULATING A SEMICONDUCTOR DEVICE HAVING A HEAT SINK

This is a divisional application of Ser. No. 07/987,490, filed Dec. 07, 1992, U.S. Pat. No. 5,514,913.

BACKGROUND AND SUMMARY OF THE INVENTION

The present invention relates to packaged semiconductor devices and to methods for packaging, and particularly to resin-encapsulated and fully insulated packages for discrete or integrated devices.

The basic requirements in packaging semiconductor devices are to provide environmental protection, while also providing wiring from the semiconductor chip to external connections. A vast variety of approaches have been proposed for this.

Among the many fully insulated device packages previously proposed is the ISOWATT-218 package, generally shown in FIG. 1, and various similar packages. These include ISOWATT-220 packages, as well as ISOWATT-221 and others. See the SGS-Thompson databooks on POWER BIPOLAR TRANSISTORS (1.ed. 1989), and SCRs AND TRIACS (2nd ed. 1991), both of which are hereby incorporated by reference. This type of package has a through-hole tab which can be used to achieve good thermal conductivity (by bolting this tab to a heat sink). The disclosed innovations will be described with specific reference to this type of package, but are not strictly limited to such packages.

A problem encountered in the manufacture of semiconductor devices encapsulated in resin and electrically insulated is ensuring a satisfactory level of quality and reliability of the electrical insulation provided by the package. Problems may be manifested in the following drawbacks:

the high pressure with which the resin is injected in the die during the transfer molding process, the possibility of detachment or resin breakage under the metal plate which supports the semiconductor chip, the considerable risk of defects in the resin near pins which ensure plate positioning during the transfer molding process, and the possibility of defective horizontal positioning of the metal plate in the die during the transfer molding process.

The disclosed inventions advantageously provide an electrically insulated plastic device completely surrounded by resin which is obtainable by a more tolerant manufacturing process than in the prior art.

A further advantage is a process for manufacturing defect-free plastic devices with a high level of reliability without increasing manufacturing costs.

The semiconductor device in the present invention comprises a resin enclosure and a metal plate surrounded by the enclosure. Onto this plate is brazed a semiconductor chip, on one end of which there is an external connector and on the other end a through hole. This through hole allows the attachment of the device to an external support and/or heat sink. Preferably the plate outline has on a second side, opposite that which leads to the connector, a recess. This recess, in its innermost part, radious with said hole in the plate; and this recess displays an extension mouth not smaller than the diameter of said hole. The plate has on the two remaining sides additional lateral indentations extending for at least one third of their length, and the plate surface opposite the side that supports the semiconductor chip has a step transition between first and second planar portions.

Other inventive solutions are indicated in the claims set forth below.

BRIEF DESCRIPTION OF THE DRAWING

The present invention will be described with reference to the accompanying drawings, which show important sample embodiments of the invention and which are incorporated in the specification hereof by reference, wherein:

FIGS. 3a–3b show a top and a cross section view not in scale of the device of FIG. 1.

DESCRIPTION OF THE PREFERRED EMBODIMENTS

Figure 1:
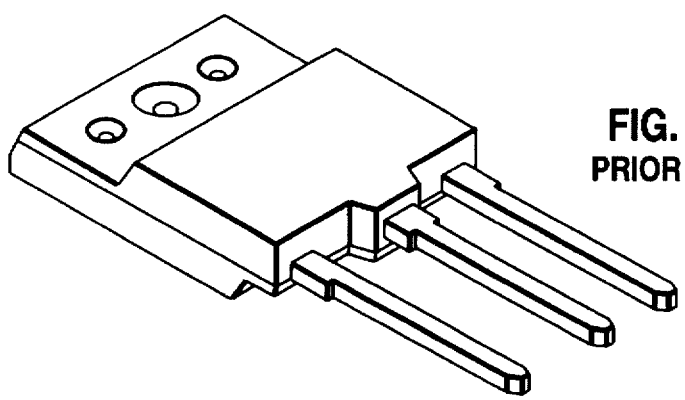
FIG. 1 shows an isometric view of an electrically insulated device in accordance with the known art.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

FIGS. 1, 2a–2c and 3a–3b represent an example of a known encapsulation process and the device obtained.

A description of this process can be found in U.S. Pat. No. 4,888,307, which is hereby incorporated by reference. The device (see FIGS. 1 and 3) comprises a metal plate (2) surrounded by a resin enclosure (3). A semiconductor chip (4) is affixed to the metal plate (2), by brazing alloy. Metal terminals (5a, 5b) are surrounded partly by the resin body (3) and are electrically connected to the plate (2) by wires (6). The central terminal (5) is an extension of the plate and acts as the transistor collector. A through hole (7) both in the metal plate and in the resin body allows attachment of the device to a suitable external support or heat sink. Electrical insulation of the device is provided by the same resin (3) which completely surrounds the metal plate (2), covering its lower surface with a thin insulating layer (8).

Figure 2A:
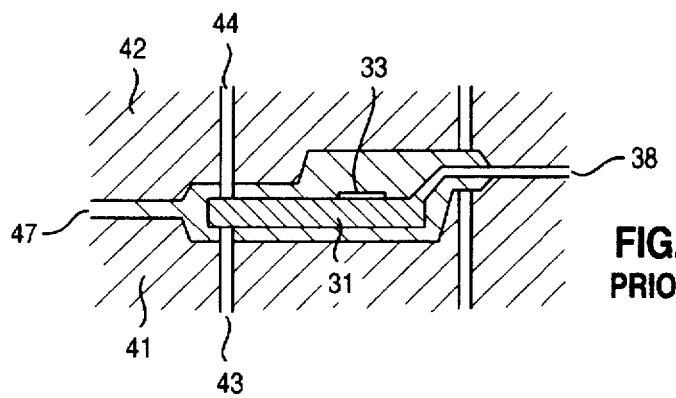
FIGS. 2a–2c show schematically some phases of a known encapsulation process.
Figure 2B:
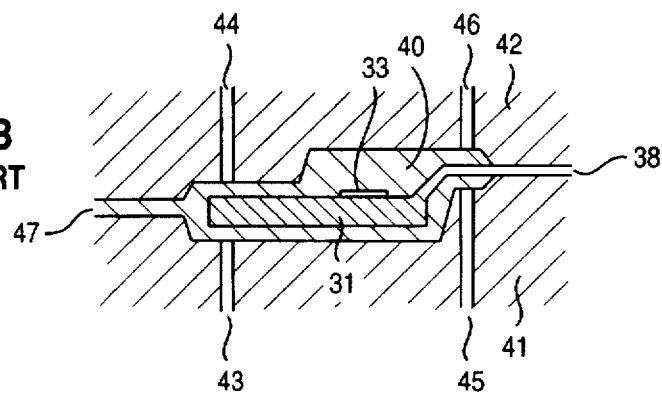
Figure 2C:
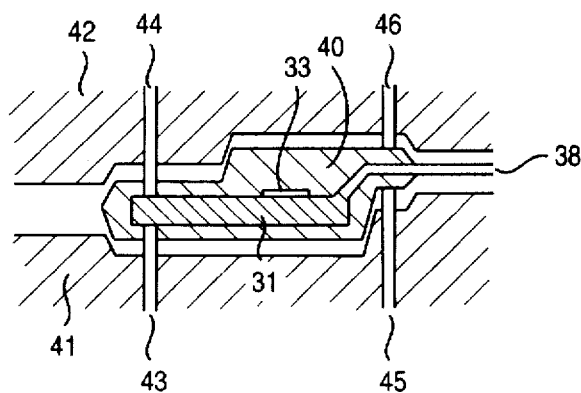

The device is encapsulated by a process of transfer molding with an epoxy resin using a suitable die. FIGS. 2a–2c illustrate some steps of a known process. (In the figures the metal plate of the device, the central terminal and the semiconductor chip are indicated by 31, 38 and 33 respectively.) These steps call for positioning the plate in the cavity of a die (41/42), by means of retractable pins (43, 44) and the injection of resin through a duct (47, FIG. 2a). Once the resin has filled the die cavity, the pins (43, 44) are retracted and injection of resin is continued to fill the cavities left by the pins (FIG. 2b). The package obtained is extracted from the die by use of the positioning pins (43, 44) and knockout pins (45, 46).

The problems, and shortcomings of this package and related known processes can be explained by the following.

1. The resin is injected at high pressure during the transfer molding process: Insulation obtained from the molding resin calls for a low defect level. This is especially true of the thin resin layer under the metal plate which must withstand high voltages. The low defect requirement, and the high hydrodynamic resistance encountered by the resin during injection into the die cavity, makes it necessary to use high resin injection pressure during the molding process.

The use of high pressures solves the mentioned problems, but may cause other problems such as:

harmful die cavity wall erosion with resulting significant lowering of die life, movement or breakage of the wires which connect the semiconductor chip to the external connectors, 2. There is a significant possibility of defects in the resin in the positioning pin regions: during the encapsulation process, injection must continue at high viscosity after withdrawal of the pins (43, 44), in order to fill the cavities left by the pins.

This avoids undesirable plate movement; but, because of the needed higher viscosity, this can produce poor compacting of the resin. This can result in porosity, reduced thickness, and poor electrical insulation in the region opposite the retractable pins.

3. There is a possibility of resin detachment or breakage under the plate: poor adhesion of the thin resin layer can cause loss of package flatness in the region near the heat sink or even fracturing of the layer (8).

Different thermal properties of the resin and the metal plate in combination with the various thermal cycles encountered during the process create shear stress at the metal plate-resin junction.

This condition can lead to poor contact at the junction or breakage. This can result in poor heat conductance and poor electrical insulation.

4. There is a possibility of poor horizontal metal plate positioning in the die. Metal plate positioning in the die cavity in the prior art ensures uniform thickness of the layer (8) of insulation resin.

The positioning of the terminal part of the plate (the end farthest from the central terminal 5) is critical. The proper plate position is ensured by the part of the die which blocks the central terminal 5. This does not ensure centering of the terminal part of the plate. (FIG. 3a of the known device, showing the plate perfectly centered in relation to the side walls of the resin enclosure, merely represents an ideal case.)

The plate may be found to be improperly spaced from the die wall, or even touching them. Because of the critical nature of plate position, this can lead to loss of electrical insulation.

Figure 4A:
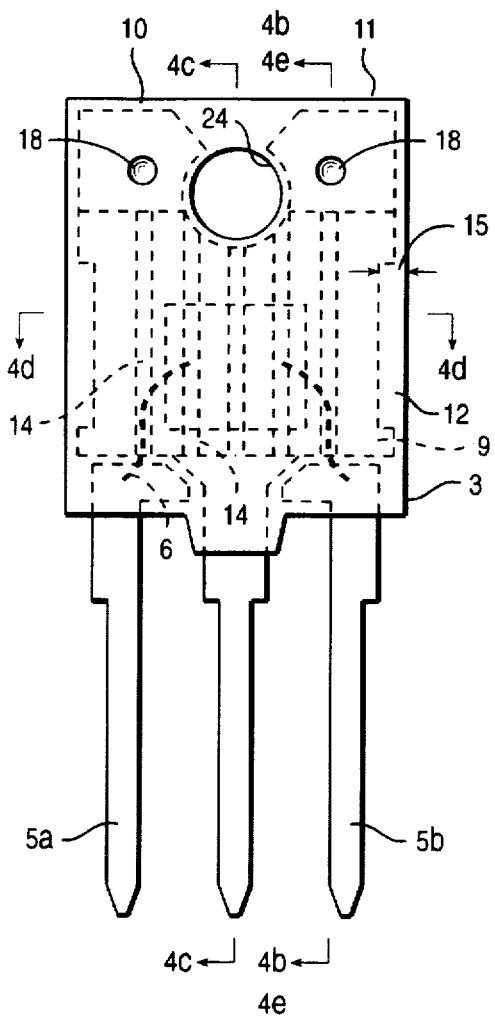
FIGS. 4a–4e show a top and various cross section views of a device in the present invention.
Figures 4B, 4C:
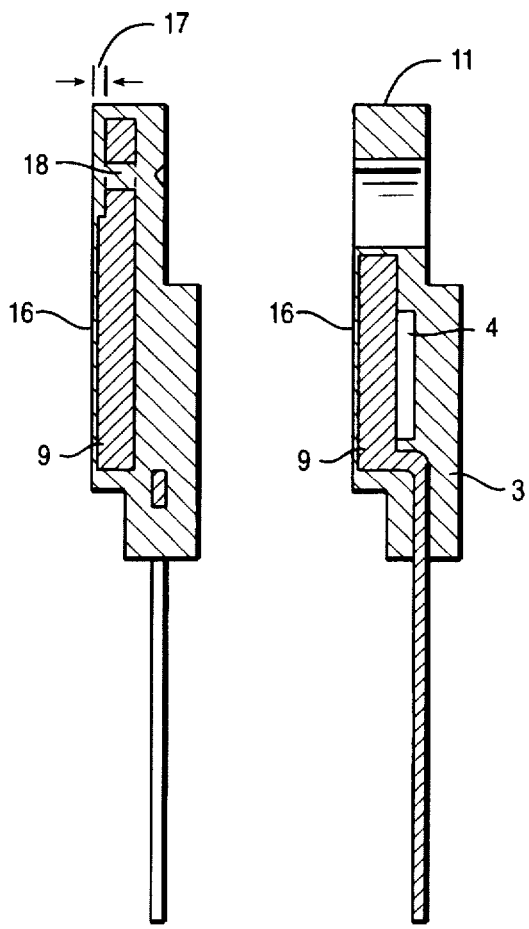
Figure 4D:
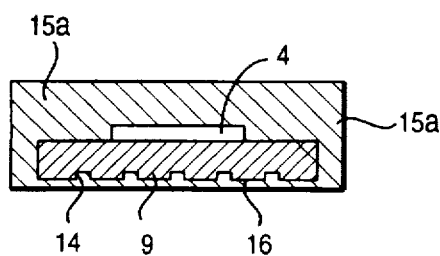
Figure 4E:
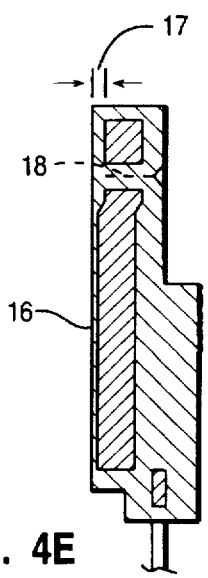
Figure 5A:
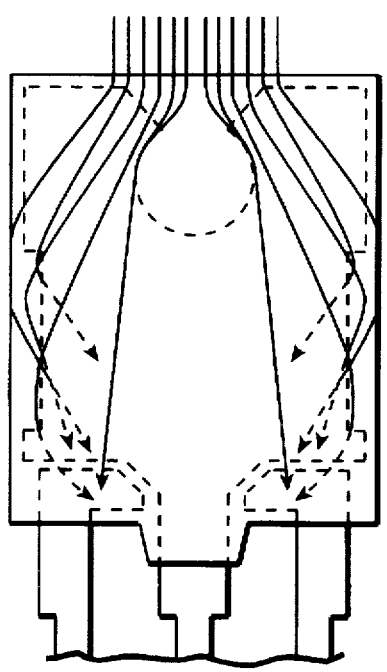
FIGS. 5a–5d show a top view and side view of the flow lines of the resin inside the cavity of the die during the encapsulation process in the present invention and in the prior art respectively.
Figure 5C:
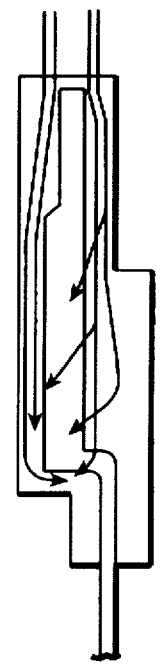
Figure 5B:
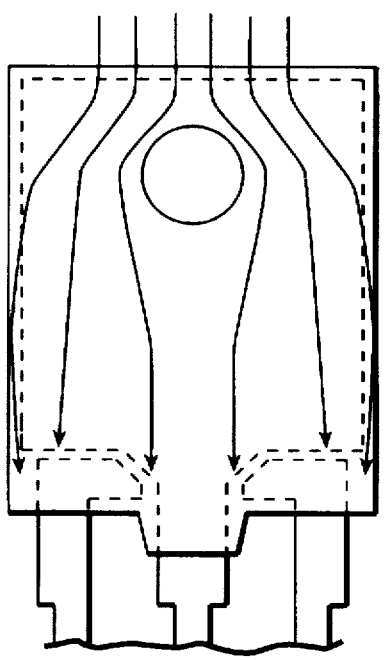
Figure 5D:
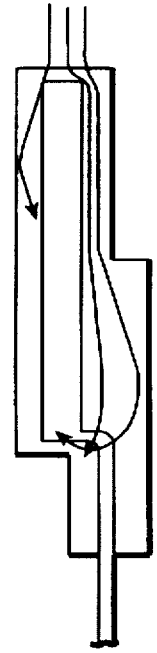

FIGS. 4a–4d illustrate the structure of a device according to the presently preferred embodiment. This embodiment includes the following features:

The hole (24) in the metal plate is open opposite the input slot of the resin in the die cavity (the position of this slot is indicated by 11 in FIG. 4a).

two lateral indentations (12) are present in the plate in the region where the semiconductor chip is present, the plate surface, opposite that to which leads the central connector, includes a discontinuity of height 17 (visible, in alternative embodiments, in FIGS. 4b and 4e, near item 18). This discontinuity can be created be milling or bending.

grooves (14) are found on the back of the plate in the region (16)(covered by a thin layer of resin). These grooves are parallel with the lateral indentations (12) described earlier.

The above characteristics provide significant advantages, for the following reasons:

a) The opening (10) in the metal plate drastically lowers the hydrodynamic resistance of the resin during its input into the die cavity so the resin can flow freely without hinderance.

b) Lateral indentations (12) increase the distance (15) between the plate (9) and the walls of the die (13). These indentations also allow an increased flow of resin into the thin insulation layer (16); this allows formation of the insulation layer (16) by resin flows from two directions. The resin flows not only parallel to the layer (16), but also perpendicularly (through the lateral indentations 12). The opening (10) and the lateral indentations (12) allow better die filling with low pressures. Once the resin has solidified, these features create a hook (15 and 15a) where the plate and the resin meet. This hook (15 and 15a) strengthens the structure by reducing the stresses which the solid resin places on the semiconductor chip.

c) Greater thickness of the resin opposite the positioning pin zone (18) reduces by half the electrical field of the device when a voltage is applied. Also filling the space left by the positioning pins is greatly facilitated. These two improvements eliminate the defects of the insulation layer (16) as shown in prior art.

d) Longitudinal channels (14) facilitate the creation of the layer (16) by allowing better resin flow. Moreover, the surface area added by these channels improves adhesion between the resin layer (16) and the metal plate (9). These improvements assist in avoiding the creation of defects (porousness of the resin, nonuniformity of the layer, etc.) which cause electrical insulation alterations.

In addition, these channels increase the contact surface area and act as hooks between the resin layer (16) and the plate (9) to improve adhesion between these two materials.

This eliminates the possibility of detachment of the resin from the metal plate and reduces fracturing of the insulation layer (16).

FIGS. 5a–5d show top and side views of the flow lines of the resin in the die cavity during the encapsulation process in the present invention (5a) and the prior art (5b) respectively. The figures confirm the inventive solutions described above by showing increased resin flow in the die cavity and facilitated filling of the die cavity on the side under the plate.

This allows a lower resin pressure to be used during the transfer molding process.

Because of these innovations, there is not only increased die lifespan but the problems connected with use of high transfer molding pressures are eliminated. For example, in a sample embodiment (using a conventional thermosetting epoxy resin, at a liquid-phase injection temperature of 180° C.), the injection pressure used without the disclosed inventions was 100 BAR. With the use of the described inventions, it was found possible to reduce the injection pressure to 70 BAR.

The presence of the two holes in the metal plate (18) adjacent to the hole (24) (FIGS. 4a, 4b, 4e) is advantageous because it allows correct horizontal positioning of the plate in the die cavity during the encapsulation process. (In the context of the other disclosed innovations, the presence of these holes is not necessary for correct vertical positioning of the chip in the die, as stated in U.S. Pat. No. 4,888,307).

FIGS. 6a–6f illustrate some steps of an encapsulation process in the present invention that are designed to ensure correct horizontal positioning of the, metal plate inside the die cavity. The figures show a die cavity cross section along a plane through the axes of the two pins nearest the package fixing hole. (The hole is not shown so the diagram will be easier to view.) In the present invention the positioning pins (20) with tapered ends (19) make contact with the plate (9) to position it in the die.

In FIG. 6, the tapered end shown forms an angle of approximately 70 degrees. In the plate are two through holes (18) having diameter equal to the base of the tapered points.

Before the injection step, if the metal plate is not centered horizontally in relation to the die side walls (FIGS. 6a and 7b), the centering system will position the plate correctly in the cavity (FIGS. 6c and 7a), holding it in the correct position during the entire molding process.

Figure 6A:
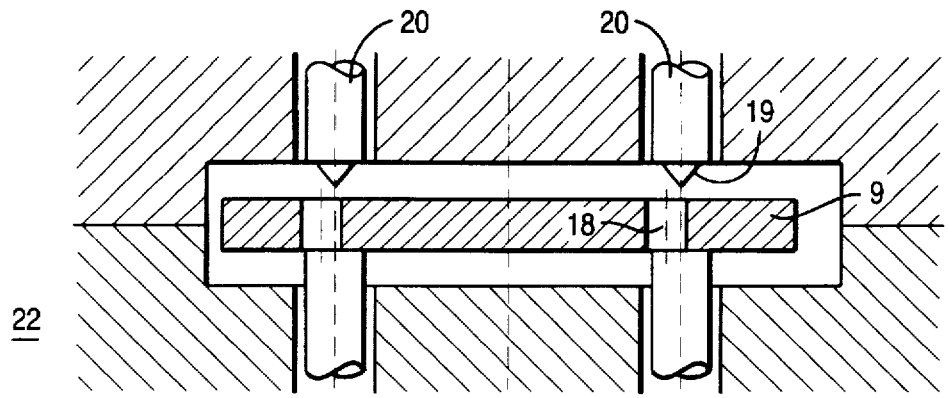
FIGS. 6a–6f show cross sections of some encapsulation process phases for the metal plate positioning system in the present invention.

FIG. 6a represents the moment when the plate (9) is placed in the cavity (22) of the die in an off center position.

Figure 6B:
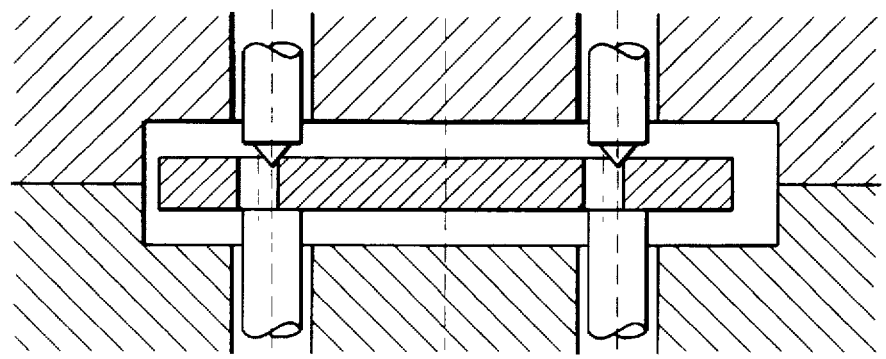

FIG. 6b shows the pins in the positioning process. The tapered point (19) of the pins acts on the hole (18), moving the plate inside the die cavity and thereby centering it perfectly.

Figure 6C:
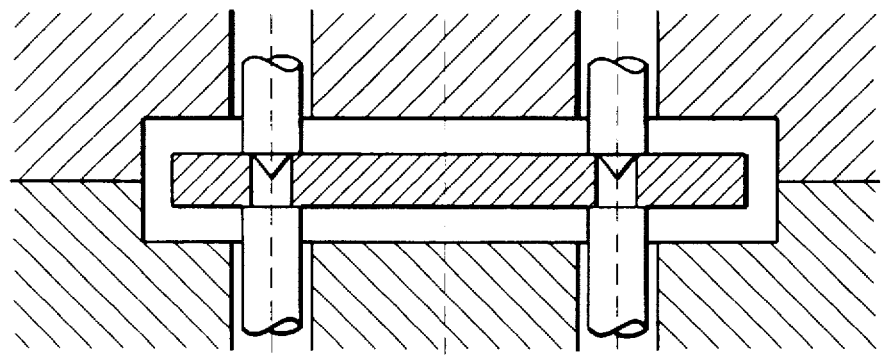

FIG. 6c shows the system with the plate correctly positioned at the beginning of filling.

The diameter of the base of the tapered point less than the diameter of the pins creates an annular surface on which the centered plate rests. This prevents vertical movement of the plate.

Figure 6D:
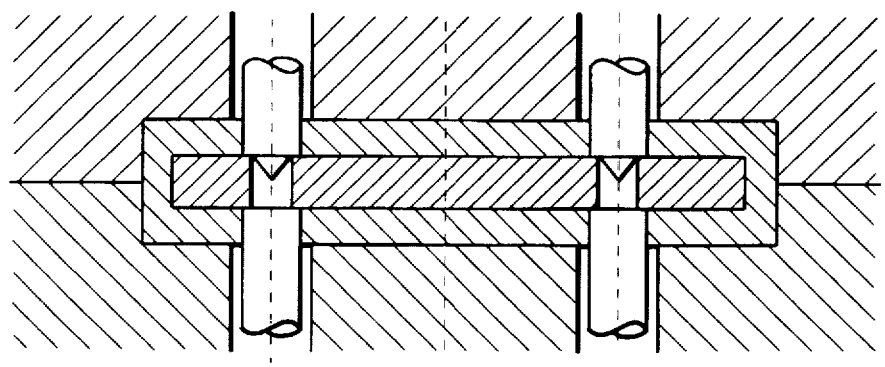

FIG. 6d shows the die cavity filled with resin with the plate correctly centered.

Figure 6E:
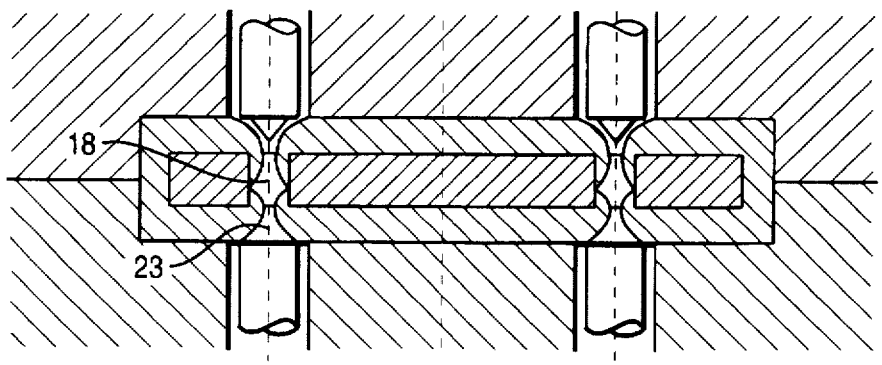

FIG. 6e shows the phase where the pins are withdrawn and the resin continues to flow to fill the cavity (23) left by the pins and the through holes (18).

Figure 6F:
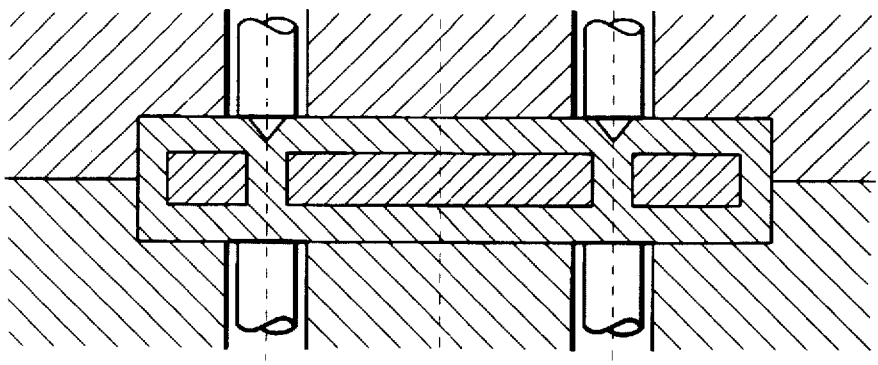

FIG. 6f shows the die cavity entirely filled with resin already solidified with the semiconductor device and the metal plate correctly centered. At this time, it is ready to be knocked out in accordance with prior known procedure.

It is clear that correct positioning created by the above innovative procedure ensures proper electrical insulation even on the side walls of the package.

Although the invention has been described in only one embodiment, it is evident that many alternatives and variations will be apparent to those skilled in the art. Indeed, the following variants can be considered:

the tapered pin system instead of being provided on the top of the die could be provided on the bottom of the die;

the tapered pin system could be provided both on the top and the bottom.

In addition, only one positioning hole and a corresponding pair of pins of which at least one is tapered, and two additional pins each having flat points could be sufficient.

Another contemplated variation involves the plate: In the plate where the tapered point pins act, the through holes 18 can alternatively be blind, as long as their depth was equal to or greater than the height of the tapered point of the pin. In this case, too, these holes still fulfill the functions of centering as set forth above.

Figure 7A:
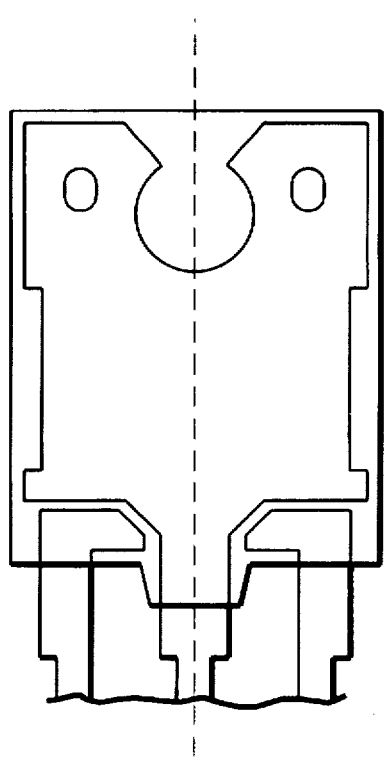
FIGS. 7a–7b show a top view of the metal plate in the present invention after and before centering.
Figure 7B:
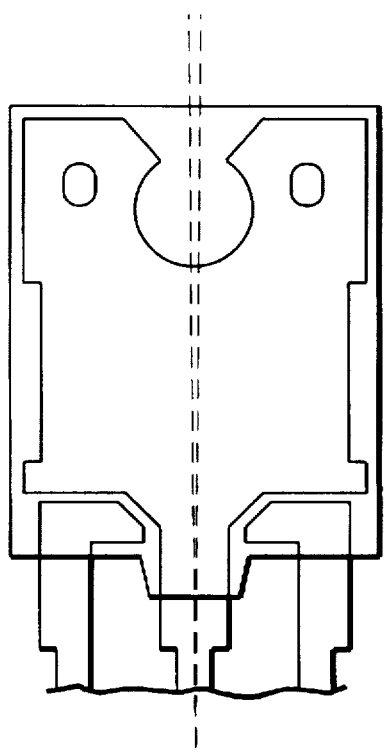

Another contemplated variation calls for the positioning holes, whether through or blind, to be noncircular, e.g. elliptical, as shown in FIGS. 7a and 7b. What matters is that the hole have a shape to allow penetration of only the tapered point and not the rest of the pin. In case of elliptical holes, they must have their major axis parallel to the axis of the central connector and their minor axis of a length equal to the diameter of the base of the tapered point of the pins. The elliptical holes display the advantage, in comparison with round holes, of permitting input of the resin when the pins are in fully inserted position (position of FIG. 6d).

It is equally clear that the device with three terminals described can be generalized for other packages completely surrounded by resin and electrically insulated. As another example, the device in the present invention can have more than three metal terminals as would be found in integrated circuits.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the present invention is not limited solely to packaging of three-terminal devices, but can also be used for packaging of two- and four-terminal devices.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A fabrication method, comprising the steps of:
   (a) providing a thermally conductive plate having an aperture in proximity to a first edge thereof, and an opening which connects said aperture to a first edge of said plate; wherein said plate further comprises lateral indentations in second and third edges thereof which are adjacent to said first edge;
   (b) attaching an electronic device to a first surface of said plate;
      wherein a second surface of said plate, opposite to said first surface, includes first and second flat portions which are parallel but not coplanar, said first flat portion of said second surface of said plate being closer to said first edge of said plate than is said second flat portion, and also being closer to said first surface of said plate than is said second flat portion; and wherein said plate also comprises multiple longitudinal channels in said second surface;
   (c) electrically connecting said electronic device to one or more conductive fingers, through one or more bond wires;
   (d) placing said plate, with said bond wires and said electronic device, in a mold, and injecting a liquid polymer into said mold from an end near said first edge of said plate to form a polymer body completely enclosing said electronic device, and also enclosing said plate and said fingers near said device;
      wherein, during said molding process, correct positioning of the plate in the die is ensured by at least two pairs of retractable pins penetrating in the die and holding the plate; and
      wherein said plate includes two additional holes separate from said aperture, and contact of at least one pair of pins takes place opposite said additional holes;

wherein at least one pin, of each said pair of pins, has a tapered point with the base of the point having a diameter smaller than the diameter of the related pin, wherein said additional holes have form and dimensions to allow penetration of said tapered point but not the rest of said pin;

wherein said additional holes each have an elliptical profile with the major axis thereof parallel to said third edge of said plate, a minor axis thereof approximately equal to the diameter of the base of the tapered point of the pins.

2. A method for packaging a semiconductor device, comprising the steps of:

(a) attaching the device to a first surface of a thermally conductive plate which includes positioning holes therein;

(b) providing an electrical connection to at least one point on the device;

(c) positioning the plate in a mold cavity, using retractable pins which engage said positioning holes;

(d) injecting encapsulating resin into said mold cavity from a first end thereof; and (e) removing the device, encapsulated in resin, from the mold cavity;

wherein said plate has a through hole therein in proximity to a first edge thereof, and a tapered recess in said first edge which in its innermost part joins with said through hole;

whereby injection of resin in said step (d.) is facilitated by the shape of said plate.

3. The method of claim 2, wherein said positioning holes are not round.

4. The method of claim 2, wherein said plate comprises an elongated extension, and said positioning step (c) does not enclose said extension within said mold cavity, and said injecting step (d) does not encapsulate said extension.

5. The method of claim 2, wherein said attaching step (a) brazes the device to said plate.

6. The method of claim 2, wherein a second surface of said plate, which is opposite to said first surface, includes a series of grooves substantially parallel to said second and third edges.

7. The method of claim 2, wherein said resin is a thermosetting epoxy resin.

8. The method of claim 2, wherein said plate further comprises lateral indentations in second and third edges thereof which are adjacent to said first edge.

9. The method of claim 2, wherein a second surface of said plate, opposite to said first surface, includes first and second flat portions which are parallel but not coplanar.

10. The method of claim 2, wherein a second surface of said plate, opposite to said first surface, has a stepped lowering near said first edge.

11. A method for packaging a semiconductor device, comprising the steps of:

(a) attaching the device to a first surface of a thermally conductive plate;

(b) providing an electrical connection to at least one point on the device;

(c) positioning the plate in a mold cavity;

(d) injecting encapsulating resin into said mold cavity from a first end thereof; and (e) removing the device, encapsulated in resin, from the mold cavity;

wherein said plate has a through hole therein in proximity to a first edge thereof, and a tapered recess in said first edge which in its innermost part is joined with said through hole;

whereby injection of resin in said step (d.) is facilitated by the shape of said plate.

12. The method of claim 11, wherein said plate comprises an elongated extension, and said positioning step (c) does not enclose said extension within said mold cavity, and said injecting step (d) does not encapsulate said extension.

13. The method of claim 11, wherein said attaching step (a) brazes the device to said plate.

14. The method of claim 11, wherein a second surface of said plate, which is opposite to said first surface, includes a series of grooves substantially parallel to said second and third edges.

15. The method of claim 11, wherein said resin is a thermosetting epoxy resin.

16. The method of claim 11, wherein said plate further comprises lateral indentations in second and third edges thereof which are adjacent to said first edge.

17. The method of claim 11, wherein a second surface of said plate, opposite to said first surface, includes first and second flat portions which are parallel but not coplanar.

18. The method of claim 11, wherein a second surface of said plate, opposite to said first surface, has a stepped lowering near said first edge.

* * * * *